United States Patent [19]
Queyssac

[11] Patent Number: 5,950,072
[45] Date of Patent: Sep. 7, 1999

[54] LOW-PROFILE REMOVABLE BALL-GRID-ARRAY INTEGRATED CIRCUIT PACKAGE

[75] Inventor: Daniel G. Queyssac, Scottsdale, Ariz.

[73] Assignee: STMicroelectronics, Inc., Carrollton, Tex.

[21] Appl. No.: 08/900,674

[22] Filed: Jul. 25, 1997

[51] Int. Cl.⁶ .......................... H01L 21/44; H01L 21/48; H01L 21/50

[52] U.S. Cl. ................. 438/118; 438/106; 438/108; 438/126

[58] Field of Search .................... 438/118, 108, 438/126, 106

[56] References Cited

U.S. PATENT DOCUMENTS

| | | | |
|---|---|---|---|
| 5,355,283 | 10/1994 | Marrs et al. | 361/760 |
| 5,357,672 | 10/1994 | Newman | 29/830 |
| 5,362,679 | 11/1994 | Wakefield | 437/206 |
| 5,376,010 | 12/1994 | Petersen | 439/71 |
| 5,400,220 | 3/1995 | Swamy | 361/760 |
| 5,419,710 | 5/1995 | Pfaff | 439/266 |
| 5,436,503 | 7/1995 | Kunitomo et al. | 257/737 |

FOREIGN PATENT DOCUMENTS

| 4-28260 | 1/1992 | Japan | H01L 25/065 |
|---|---|---|---|

OTHER PUBLICATIONS

Alphametals Technical Bulletin: "Application of Staystik 101 (paste) $ 501 (film) High Temperature Thermoplastics in Hermetic Ceramic Packages".

*Primary Examiner*—Kevin M. Picardat
*Assistant Examiner*—Deven Collins
*Attorney, Agent, or Firm*—Theodore E. Galanthay; Lisa K. Jorgenson

[57] ABSTRACT

An integrated circuit package had leadless solderballs attached to the substrate with a conductive thermoplastic adhesive. The leadless solderballs are preferably made with a copper-nickel-gold alloy. The conductive thermoplastic is preferably of the silver fill type. The integrated circuit package is placed in a frame and held to the printed circuit board with a clamp or with a screw.

18 Claims, 2 Drawing Sheets

LOW-PROFILE REMOVABLE BALL-GRID-ARRAY INTEGRATED CIRCUIT PACKAGE

This is a Division of application Ser. No. 08/508,919, filed Jul. 28, 1995, now U.S. Pat. No. 5,714,803.

BACKGROUND OF THE INVENTION

1. Field of the Invention

This invention relates to the field of integrated circuits, and is more particularly directed to packages therefor, and still more particularly to ball-grid-array integrated circuit packages.

2. Description of the Relevant Art

Modern microprocessor-based data processing systems, particularly personal computers and computer workstations, are commonly upgradable in performance and capability. Typically, this upgrading is performed by replacing the originally installed microprocessor that serves as the central processing unit with a higher performance or more capable microprocessor. For example, one may upgrade a 386-based personal computer by removing the originally installed 386-type microprocessor and inserting, in its place, a 486-type microprocessor; by way of further example, one may upgrade the central processing unit by replacing the originally installed microprocessor with a microprocessor of the same type (e.g., 486-type) that can operate at a faster clock rate. Of course, other simple and minor adjustments of certain settings in the computer may also need to be made to accommodate the upgraded central processing unit. Additionally, the manufacturers of personal computers often install the microprocessor last to delay the associated financial commitment as much as possible and also because of certain import tax obligations.

Therefore, in the manufacture of upgradable personal computers, certain integrated circuits (e.g., at least the microprocessor) are installed into the system circuit board by way of sockets, rather than by being soldered directly to the circuit board, to facilitate removal and reinstallation of these components. Conventional sockets include sockets of the type that apply a mechanical force to pins of the integrated circuits so as to make contact thereto. However, as the number of terminals for microprocessors increase to more than 150 terminals, the total friction encountered in removing the microprocessor from such sockets becomes substantial, and may require a removal force of such magnitude as to crack or otherwise damage the board. While zero-insertion force sockets are also well known in the art, these sockets are generally quite expensive.

In addition, it is of course desirable to manufacture circuit boards with low-profile components, so that the overall height of the circuit board and its components is relatively low. This allows for the size of the overall system to be quite small, which is especially important for portable personal computers, such as those of the popular notebook size. However, conventional sockets, such as those described above, significantly raise the height of the circuit board and its components. The system designer and user are thus faced with the choice between reduced system size and upgradability in these circumstances.

By way of further background, ball-grid-array (BGA) packages have become popular in the art, particularly for packaging microprocessors. As is well known, the terminals of a BGA package are solder balls, formed on the underside of the package and attached to plated lands thereat. A solder reflow process is then used to attach the BGA component to a circuit board after its placement thereat; the heat of the reflow process melts the solder balls so that they will wet to lands on the circuit board, thus electrically and mechanically connecting the component thereto. The solder reflow process is especially useful as it can be done at relatively low temperatures, and the ability to surface-mount the BGA packaged component eliminates the requirement of plated-through holes in the system circuit board. In addition, BGA packages allow a large number of terminals to occupy a small board area, as the pitch of solder balls on the package can be quite small (e.g., on the order of 0.1 cm). The BGA package is also a very low profile package, and is thus especially suitable for small systems such as notebook-size personal computers and the like.

However, according to the current state of the art, the benefits of BGA packages are not available if the component is to be installed by way of a socket. Firstly, the low profile provided by the BGA package is lost, for the most part, when the height of the socket is to be added to the system. Secondly, the solder balls tend to provide poor performance as a mechanical connection (i.e., when not reflowed to provide a solder connection). This is because conventional solder compositions tend to migrate, or creep, under mechanical force. In addition, the mechanical force required to make electrical contact to a cold solder ball is quite high (e.g., on the order of one ounce), exacerbating the problem of solder creep under mechanical stress. This high contact force is required in order to overcome the native oxide that rapidly forms over the surface of conventional solder balls. Despite these barriers, sockets for making removable connection to solder balls on a BGA package are known in the art, as will now be described relative to certain examples.

FIGS. 1a and 1b illustrate an example of a conventional socket for BGA components, such as is available from Method Electronics, Inc. In this example, referring to FIG. 1a, BGA package 2 is converted into a pin-grid-array package (PGA), by reflow soldering of the BGA package 2 to pin board 4. As shown in the cross-section of FIG. 1b, pin board 4 solder connects each solder ball 3 of BGA package 2 to a corresponding pin 5 extending through pin board 4. The combination of BGA package 2 and pin board 4, so assembled, acts as a PGA package, and may now be inserted into conventional socket 6 that is soldered to the surface of system circuit board 8. As shown in detail in FIG. 1b, each of pins 5 of pin board 4 extend into and are received by pin sockets 7 in socket 6. Pin sockets 7 are each soldered to system circuit board 8, by way of solder joints 9 as shown in FIG. 1b. However, as is evident from FIG. 1b, the presence of both socket 6 and pin board 4, along with the height of reflowed solder balls 3, result in a relatively high profile combination package system. Furthermore, the cost of this package system with its additional parts and extra labor can be quite high, considering that two additional piece parts (pin board 4 and socket 6) are required.

Referring now to FIGS. 2a and 2b, another example of a conventional socketing arrangement for a BGA package, manufactured and sold by AMP, will now be described for purposes of further background. As shown in FIG. 2a in cross-section, BGA package 12 has solder balls 13 connected thereto, extending from the bottom surface thereof. Solder balls 13 are received by receptacles 16 in socket 14, which in turn is soldered to system circuit board 18 by way of solder joints 19. Referring to FIG. 2b the plan view of FIG. 2a, receptacles 16 are, in this example, configured as partially split rings, so that burrs 17 are present on the inner diameter of receptacles 16. Burrs 17 serve to cut into solder balls 13 when BGA package 12 is installed over socket 14, and thus provide both mechanical support and also electrical connection between circuit board 18 and solder balls 13. However, this socketing approach requires a socket thickness of at least the height of solder balls 13 (in their cold, non-reflowed state), and also suffers from the difficulties of high contact force and solder creeping under stress to which cold solder connections are vulnerable, as noted above.

By way of further background, it is known to make removable mechanical connections between integrated circuits having solder balls disposed thereon (e.g., according to the well-known "flip chip" technology) and copper pads having plated palladium dendrites formed thereon. This approach is believed to be used in connection with hybrid, or multi-chip, modules, where replacement of faulty integrated circuit chips is desired. In this example, the solder balls are mechanically forced onto the dendrites, which serve to grip the solder ball and mechanically hold the chip in place, as well as provide electrical connection thereto. Again, the difficulties associated with high contact force and creeping of the solder material are also believed to be present in this approach.

SUMMARY OF THE INVENTION

It is therefore an object of the present invention to provide a low cost integrated circuit package which provides for low profile component placement on the printed circuit board.

It is a further object of the present invention to provide an integrated circuit package which requires a low contact force for a reliable electrical connection.

It is a further object of the present invention to provide an integrated circuit package of the type described which allows for high density placement of terminals of the integrated circuit.

Other objects and advantages of the present invention will be apparent to those of ordinary skill in the art having reference to the following specification together with its drawings.

The invention can be summarized as an integrated circuit package having leadless solderballs attached to the substrate with a conductive thermoplastic adhesive. The leadless solderballs are preferably made with a copper-nickel-gold alloy. The conductive thermoplastic is preferably of the silver fill type. The integrated circuit package is placed in a frame and held to the printed circuit board with a clamp or with a screw.

DETAILED DESCRIPTION OF THE PREFERRED EMBODIMENT

The construction of a removable ball-grid-array package will be described.

Figure 1A:
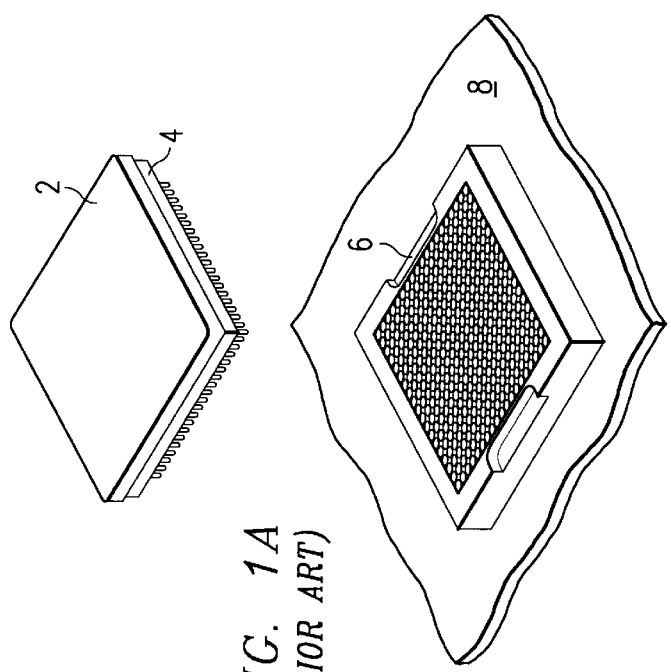
FIGS. 1a and 1b are exploded perspective and partial cross-section views, respectively, of a ball-grid-array socket system according to the prior art.
Figure 1B:
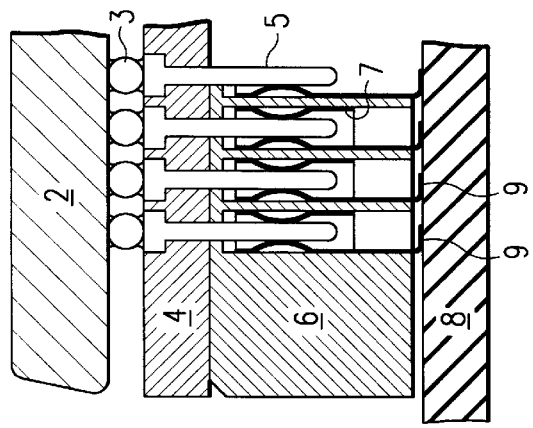
Figure 2A:
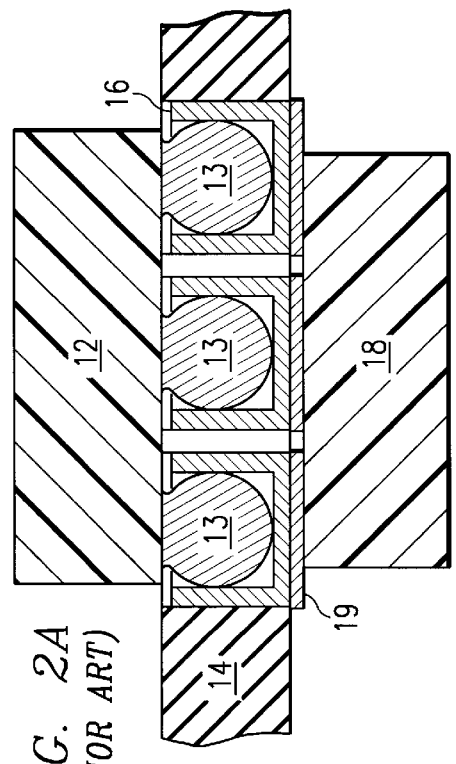
FIGS. 2a and 2b are cross-sectional and partial plan views, respectively, of another removable ball-grid-array socket system according to the prior art.
Figure 2B:
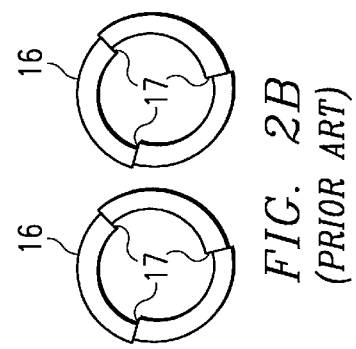
Figure 3:
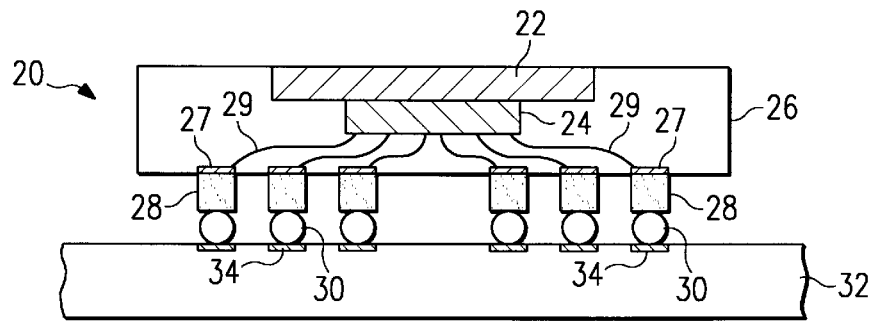
FIG. 3 is a cross-section view of the removable ball-grid-array package without a clamp according to an embodiment of the invention.

As shown in FIG. 3, a substrate 26 encloses an integrated circuit die 24 and a slug 22. The slug 22 is used as a heat sink to dissipate the heat created by integrated circuit die 24, as is known in the art. The integrated circuit 24 has many outputs, the number of which depends on the complexity of the integrated circuit 24. Each of the outputs of integrated circuit 24 is connected to a corresponding pad 27 on the underside of substrate 26 by connections 29 in a manner well known in the art. In this example, the pads are arranged in an array even though only one of two dimensions of the array are shown.

The conductive thermoplastic adhesive 28 is used to electrically and mechanically attach solder ball 30 to the pad of substrate 26. The conductive thermoplastic adhesive 28 functions to provide mechanical elasticity to the connection as well as electrical conductivity. The preferred thermoplastic adhesive 28 contains a silver fill to increase conductivity. An example of such a thermoplastic adhesive is a Staytik™ thermoplastic adhesive number 171 manufactured by Alpha Metals Inc. The use of such an adhesive is known in the art and explained in its product bulletin, which is incorporated by reference.

Also shown in FIG. 3 is the printed circuit board 32 having, in this example, six pads 34 arranged in the same pattern as the array of pads on the underside of substrate 26. The pads 34 on the printed circuit board 32 are preferably gold plated to increase the conductivity between the solder ball 30 and the pad 34.

Figure 4:
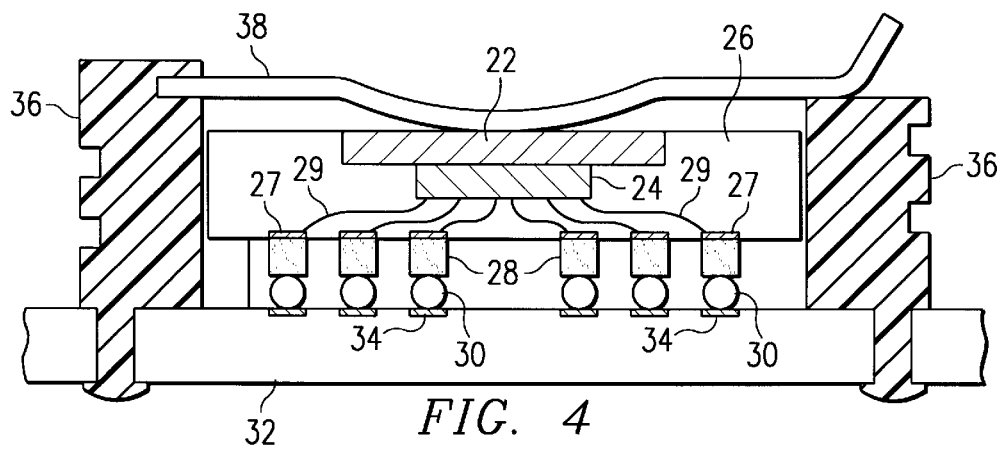
FIG. 4 is a cross-section view of the removable ball-grid-array package with a frame and clamp according to the embodiment of the invention.

For the invention to work, a low-profile frame is needed to guide to BGA package to the correct position on printed circuit board 32. FIG. 4 shows two sides of a low profile frame 36 guiding the BGA package in place. The frame 36 can also be made of heat conducting material, such as aluminum, so that the frame also serves to facilitate the dissipation of heat. FIG. 4 also shows a clamp 38 for providing a clamping means by exerting pressure on the slug 22. Thus, the clamp provides the mechanical pressure necessary to make the electrical connections through the thermoplastic adhesive 28 and solder ball 30. Additionally, clamp 38 functions as a heat sink by which the heat generated in the die 24 can be conducted through slug 22 and onto clamp 38, thereby providing cooling to the integrated circuit die 24.

It has been observed that solder balls which are a copper-nickel-gold alloy minimize the oxidation of the solder ball and thus improve conductivity over the prior art solder balls which consisted of mainly tin and lead. Additionally, the copper-nickel-gold alloy solder balls maintain their shape better, thereby avoiding the solder creeping problem of the prior art. It has also been observed that a conductive thermoplastic adhesive provides the mechanical elasticity necessary to compensate for variations in coplanarity for all the solder balls in a ball-grid-array. Thus, conductive thermoplastic adhesive provided the mechanical elasticity necessary to make mechanical contact with all the pads on the printed circuit board.

Therefore, the disclosed invention provides the benefit of having a low-profile which requires low contact force for its electrical connection and which still provides a high density placement of the pads on the substrate as well as the printed circuit board.

Figure 5:
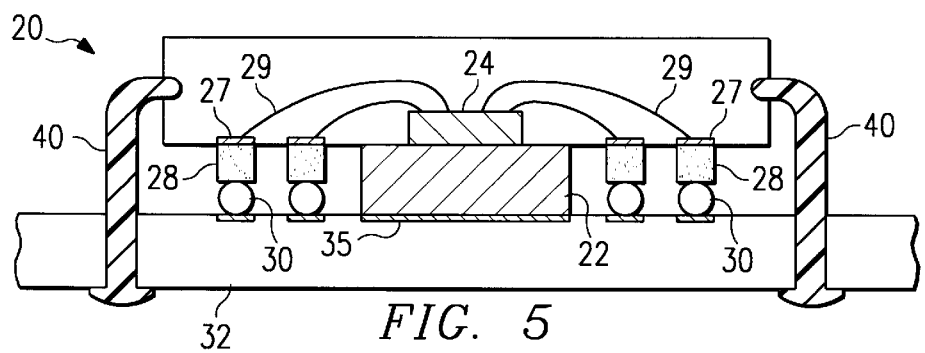
FIG. 5 is a cross-section view of the removable ball-grid-array package with a frame with an alternate embodiment of the clamp.

FIG. 5 illustrates the same inventive BGA package utilizing the conductive thermoplastic adhesive and copper-nickel-gold solder balls but differs from FIG. 4 in that it utilizes a different means for clamping the package to the printed circuit board. FIG. 5 shows BGA package 20 being aligned and held in place by socket clamps 40. In this embodiment, the heat is dissipated from integrated circuit die 24 through slug 22 onto thermal conducting material 35 on the printed circuit board 32.

Figure 6:
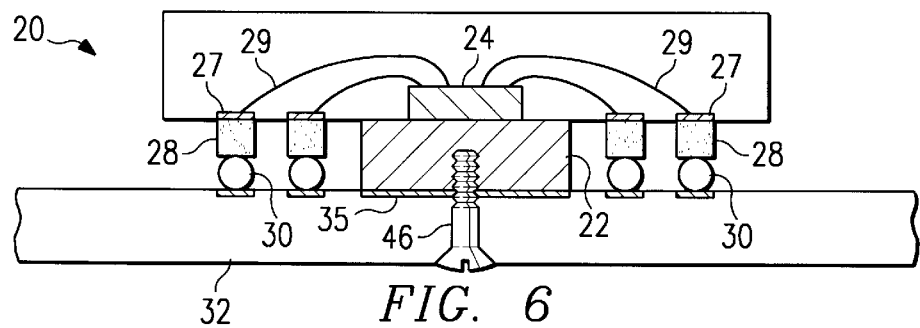
FIG. 6 is a cross-section view of the removable ball-grid-array package with a frame with a clamping screw.

FIG. 6 illustrates the same inventive BGA package utilizing the conductive thermoplastic adhesive and copper-nickel-gold solder balls but differs from FIG. 5 in that it utilizes a different means for clamping the package to the printed circuit board. In this figure, the BGA package clamped to the printed circuit board by using screw 46 which attaches to the slug 24 thereby pulling BGA package 20 closer to printed circuit board 32 as the screw 46 is tightened.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A method for mounting a ball-grid-array integrated circuit package onto a printed circuit board comprising the steps of:

attaching a conductive thermoplastic adhesive to a plurality of ball-grid pads on the integrated circuit package;

attaching a solderball to each of the conductive thermoplastic adhesives; and mounting the integrated circuit package onto the printed circuit board to selectively establish electrical contacts between the printed circuit board through the conductive thermoplastic adhesive and the solderballs.

2. The method of claim 1 wherein the step of attaching the conductive thermoplastic adhesive is accomplished using a thermoplastic adhesive with a silver fill.

3. The method of claim 1 wherein the step of attaching a solderball to each of the conductive thermoplastic adhesives comprises attaching a leadless solderball to each of the adhesives.

4. The method of claim 1 wherein the step of attaching a solderball to each of the conductive thermoplastic adhesives comprises attaching a copper-nickel-gold solderball to each of the adhesives.

5. The method of claim 1 further comprising using a silver fill in said conductive thermoplastic to increase conductivity.

6. The method of claim 1 wherein the step of mounting the integrated circuit package onto the printed circuit board comprises clamping the integrated circuit package onto the printed circuit board.

7. A method for mounting a ball-grid-array package to a printed circuit board, comprising the steps of:

applying a plurality of bodies of a mechanically elastic and electrically conducting material to electrical contacts of said ball-grid-array package;

arranging a plurality of bodies of electrically conductive material to respective ones of said bodies;

and positioning said ball-grid-array package wherein said bodies of electrically conductive material contact respective conductors of a printed circuit board.

8. The method of claim 7 wherein said step of arranging a plurality of bodies of electrically conductive material to respective ones of said bodies comprises arranging a plurality of solder balls to respective ones of said bodies.

9. The method of claim 7 further comprising providing bodies of a mechanically elastic and electrically conducting material having a silver fill.

10. The method of claim 7 further comprising clamping said ball-grid-array package to maintain its position with respect to said printed circuit board.

11. The method of claim 10 wherein said clamping step comprises arranging a spring member to clamp said ball-grid-array package in position.

12. The method of claim 10 wherein said clamping step comprises screwing said ball-grid-array package to said printed circuit board.

13. The method of claim 10 wherein said clamping step comprises clamping said ball-grid-array package to said printed circuit board with socket clamps.

14. The method of claim 10 wherein said clamping step comprises adhering said ball-grid-array package to said printed circuit board.

15. The method of claim 14 wherein said adhering step comprises adhering said ball-grid-array package to said printed circuit board with a thermoplastic adhesive.

16. The method of claim 14 further comprising providing a heat sink in contact with said ball-grid-array package and wherein said adhering step comprises adhering said heat sink to said printed circuit board with a thermoplastic adhesive.

17. The method of claim 7 further comprising mounting a frame to said printed circuit board for receiving and positioning said ball-grid-array package with said balls in contact with said respective conductors of a printed circuit board.

18. The method of claim 7 further comprising mounting an aluminum frame to said printed circuit board for receiving and positioning said ball-grid-array package with said balls in contact with said respective conductors of a printed circuit board.

\* \* \* \* \*